United States Patent
Lin et al.

(10) Patent No.: US 7,383,528 B2
(45) Date of Patent: Jun. 3, 2008

(54) METHOD FOR CHECKING AN IC LAYOUT

(75) Inventors: Jai-Ming Lin, Taichung (TW);
Chao-Cheng Lee, Hsin Chu (TW)

(73) Assignee: Realtek Semiconductor Corp.,
HsinChu (TW)

( * ) Notice: Subject to any disclaimer, the term of this patent is extended or adjusted under 35 U.S.C. 154(b) by 92 days.

(21) Appl. No.: 10/924,501

(22) Filed: Aug. 24, 2004

(65) Prior Publication Data
US 2005/0055653 A1    Mar. 10, 2005

(30) Foreign Application Priority Data
Sep. 8, 2003    (TW) .............................. 92124690 A

(51) Int. Cl.
*G06F 17/50*    (2006.01)
(52) U.S. Cl. ........................................ 716/13; 716/15
(58) Field of Classification Search ............. 716/12–15
See application file for complete search history.

(56) References Cited

U.S. PATENT DOCUMENTS

| | | | |
|---|---|---|---|
| 6,308,309 B1 * | 10/2001 | Gan et al. ....................... 716/8 |
| 6,330,707 B1 * | 12/2001 | Shinomiya et al. ............ 716/14 |
| 6,480,989 B2 * | 11/2002 | Chan et al. ..................... 716/8 |
| 6,546,538 B1 * | 4/2003 | Rubdi et al. ................... 716/12 |
| 6,598,206 B2 * | 7/2003 | Darden et al. .................. 716/2 |
| 6,725,439 B1 * | 4/2004 | Homsinger et al. ........... 716/12 |
| 6,732,335 B2 * | 5/2004 | Takabayashi et al. .......... 716/1 |
| 6,735,749 B2 | 5/2004 | Li et al. |
| 6,735,755 B2 * | 5/2004 | Shau ........................... 716/16 |
| 6,766,503 B2 * | 7/2004 | Fitzheny et al. ............... 716/12 |
| 6,823,499 B1 * | 11/2004 | Vasishta et al. ................ 716/7 |
| 6,880,143 B1 * | 4/2005 | Yu ................................. 716/8 |
| 6,925,627 B1 * | 8/2005 | Longway et al. ............. 716/13 |
| 7,013,444 B2 | 3/2006 | Igarashi et al. |
| 7,124,390 B2 * | 10/2006 | Smith et al. ................... 716/15 |
| 7,134,108 B2 * | 11/2006 | Lin et al. ........................ 716/5 |

* cited by examiner

*Primary Examiner*—Jack Chiang
*Assistant Examiner*—Binh C Tat
(74) *Attorney, Agent, or Firm*—Winston Hsu

(57) ABSTRACT

A method of the invention is used for checking a wire layout causing high wire resistance. The method includes the steps of: selecting a first metal layer, a second metal layer and a third metal layer, wherein each of the first and third metal layer includes a power wire for transmitting power, and the second metal layer is adjacent to the first and third metal layers; selecting one region in the second metal layer, wherein the first and the third metal layers have the power wires at positions corresponding to the region and the second metal layer has no wire at the region; and disposing a conductive metal layer coupled to the first and third metal layer in the region for lowering the equivalent wire resistance.

6 Claims, 6 Drawing Sheets

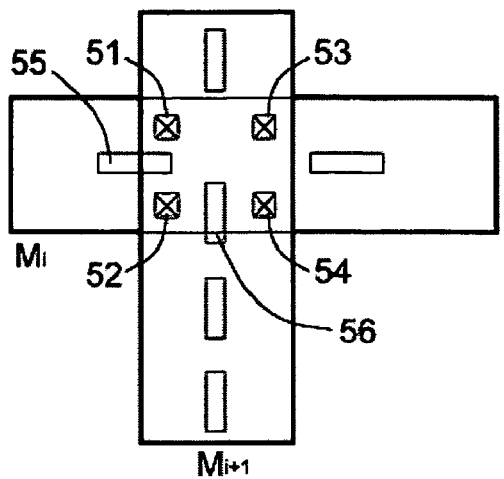
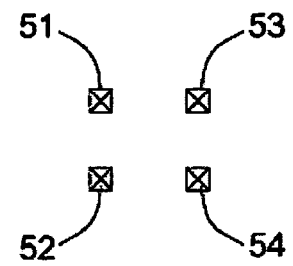
FIG. 5B
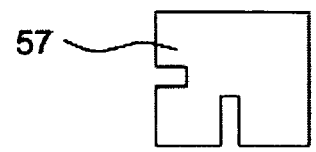
FIG. 5C
FIG. 5A
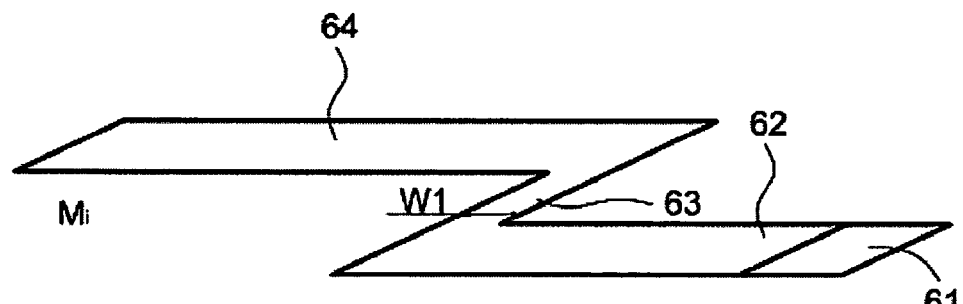
FIG. 6A
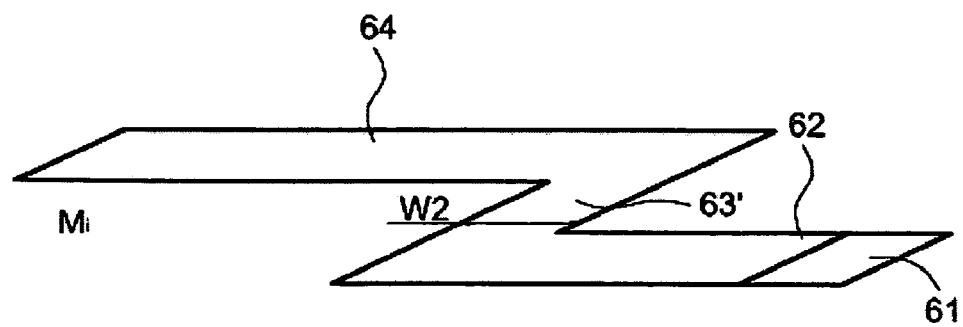
FIG. 6B

METHOD FOR CHECKING AN IC LAYOUT

This application claims the benefit of Taiwan application Serial No. 092124690, filed Sep. 8, 2003, the subject matter of which is incorporated herein by reference.

BACKGROUND OF THE INVENTION

1. Field of the Invention

The invention relates in general to a method for checking an IC layout, and more particularly to a method for checking a wire layout causing high power wire resistance in the IC layout.

2. Description of the Related Art

FIG. 1 is a partially equivalent circuit diagram showing a conventional integrated circuit (IC). Referring to FIG. 1, the equivalent circuit 10 includes a voltage source 11, a plurality of equivalent wire resistors $R_{11}$, $R_{12}$, $R_{13}$, $R_{21}$, $R_{22}$ and $R_{23}$, and a plurality of device units 12, 13 and 14. Theoretically, the equivalent resistance of an ideal wire is zero in the circuit property. In fact, however, each wire has an equivalent resistance. If the electric currents flowing through the device units 12, 13 and 14 are $I_1$, $I_2$ and $I_3$, respectively, because the equivalent wire resistors $R_{21}$, $R_{12}$ and $R_{13}$ cause voltage drops and the equivalent wire resistors $R_{21}$, $R_{22}$ and $R_{23}$ cause ground bounces, the voltages $V_{G3}$ and $V'_{G3}$ are represented in the following equations according to the ohm's law:

$$V_{G3}=V-R_{11}(I_1+I_2+I_3)-R_{12}(I_2+I_3)-R_{13}*I_3 \quad (1), \text{ and}$$

$$V'_{G3}=R_{21}(I_1+I_2+I_3)+R_{22}(I_2+I_3)+R_{23}*I_3 \quad (2).$$

Thus, the operation voltage (the voltage drop across two ends) of the device unit 14 is not the ideal voltage (VDD-GND), but is ($V_{G3}-V'_{G3}$) which is less than (VDD-GND) for $(R_{21}+R_{11})(I_1+I_2+I_3)+(R_{22}+R_{12})(I_2+I_3)+(R_{23}+R_{13})*I_3$. Hence, the larger the equivalent wire resistance is, the larger the voltage drop is. The large equivalent wire resistance may cause the timing problems and the functional failures of the device unit. The above-mentioned problem becomes worse when the IC manufacturing technology is getting more and more advanced such that the line width is getting smaller and smaller, and the wire's equivalent resistance is getting larger and larger. Thus, the difference between the actual operation voltage of the device and the ideal operation voltage thereof is getting larger and larger.

Consequently, it is an important subject of the circuit layout to effectively reduce the wire's resistance.

However, when the IC layout is done according to the currently used IC CAD (computer aided design) software, there are no known objective and effective rules and methods to judge whether or not the circuit layout causes the wire resistance too high. Instead, the circuit layout engineer can only check the complicated circuit layout with his/her naked eyes according to his/her experience for the subjective assertion. Thus, the prior art method is time-consuming, laborious, inefficient, and ineffective.

SUMMARY OF THE INVENTION

It is therefore an object of the invention to provide a method for checking an IC layout so as to check out the missed connection region, the region having insufficient via area, and the region of too-narrow wire width, which will cause the high wire resistance in the circuit layout. Thus, the layout engineer can modify the design according to the checking result so as to reduce the power source's voltage drop.

The invention achieves the above-identified object by providing a method for checking an IC layout. The method includes the steps of: selecting a first metal layer, a second metal layer and a third metal layer, wherein each of the first and third metal layer includes at least a power wire for transmitting power, and the second metal layer is adjacent to the first and the third metal layers; selecting one region in the second metal layer, wherein the first and the third metal layers have the power wires at positions corresponding to the selected region of the second metal layer, and the second metal layer has no wire in the selected region; and disposing a conductive metal layer coupled to the first and third metal layer in the region for lowering the equivalent wire resistance.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 5A shows the layout, wherein the upper and lower metal layers $M_i$ and $M_{i+1}$ are overlapped and conducted by vias.

FIG. 5B shows the region of the vias in the layout of FIG. 5A.

FIG. 5C shows the overlapped region of the metal layers in the layout of FIG. 5A.

FIG. 6A shows the layout of one metal layer.

FIG. 6B shows another layout of one metal layer with a wider wire compared to that of FIG. 6A.

DETAILED DESCRIPTION OF THE INVENTION

The method for checking an IC layout according to the embodiments of the invention will be described with reference to the accompanying drawings. The method includes steps of checking an overlapped region of power layers, checking an area ratio of via area, and checking a wire line width. The invention performs the checks according to a graphic design system file (GDS file) and a rule file and outputs a file that may be understood by the user.

Figure 1:
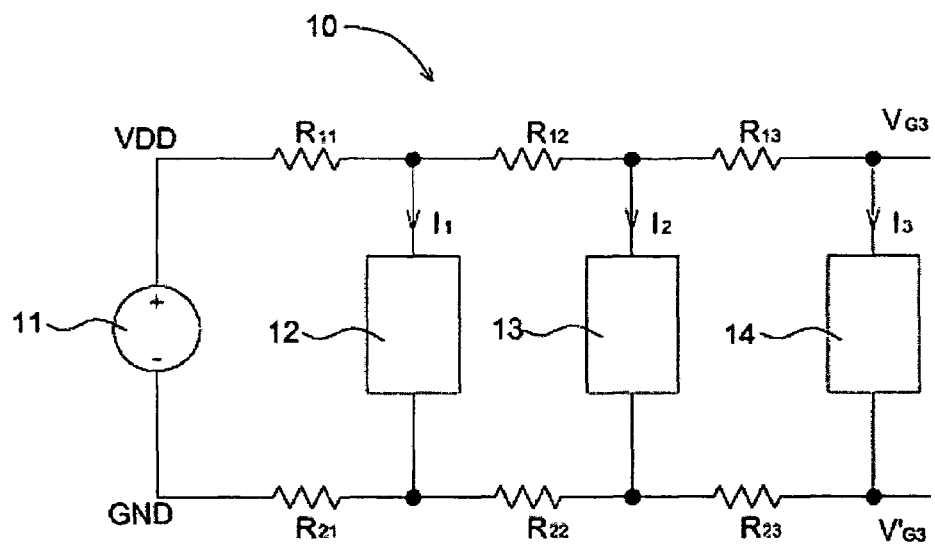
FIG. 1 is a partially equivalent circuit diagram showing a conventional integrated circuit (IC).
Figure 2A:
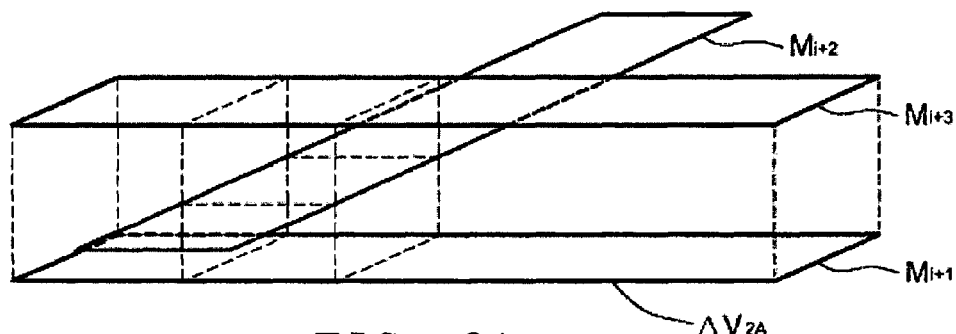
FIG. 2A shows a layout having three metal layers.
Figure 2B:
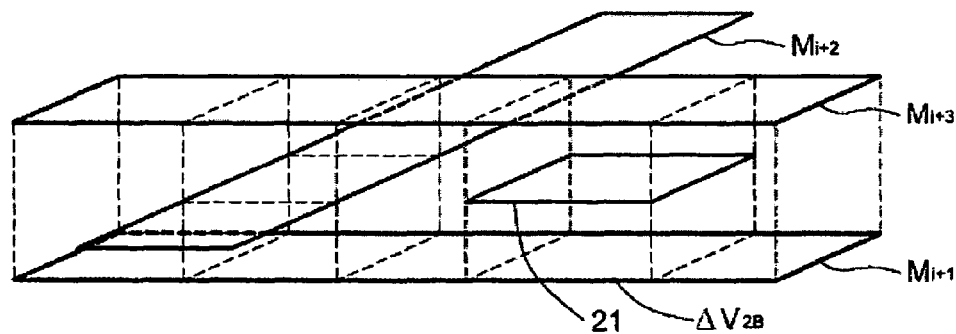
FIG. 2B shows another layout, which has lower equivalent resistance of the wire compared to that of the layout shown in FIG. 2A.

FIG. 2A shows a layout having three metal layers comprising an upper metal layer $M_{i+3}$, a lower metal layer $M_{i+1}$, and a wire region of the middle metal layer $M_{i+2}$. Of course, an insulation layer is interposed between two adjacent layers. $\Delta V_{2A}$ is the voltage difference from a point in the metal layer $M_{i+3}$ or $M_{i+1}$ to the positive or negative terminal of the voltage source. FIG. 2B shows another layout having three metal layers comprising an upper metal layer $M_{i+3}$, a lower metal layer $M_{i+1}$, and a wire region of the middle metal layer $M_{i+2}$. Of course, an insulation layer is interposed between two adjacent layers. $\Delta V_{2B}$ is the voltage difference from a point in the layer $M_{i+3}$ or $M_{i+1}$ to the positive or negative terminal of the voltage source. The layout of FIG. 2B is almost the same as that of FIG. 2A except for the metal layer 21 added to the middle layer $M_{i+2}$ exclusive of the wire region of FIG. 2B. Thus, if the upper and lower metal layers are conducted by vias through the metal layer 21, $\Delta V_{2B}$ is smaller than $\Delta V_{2A}$ because the metal layer 21 helps to conduct the two layers to reduce the wire's equivalent resistance. In other words, as long as positions in the middle layer with no wire are checked, one or more additional conductive metal layers 21 may be added to these positions and help to conduct the upper and lower metal layers $M_{i+3}$ and $M_{i+1}$ through vias, so that the power source's voltage drop caused by the wire's equivalent resistance can be effectively reduced.

Figure 3A:
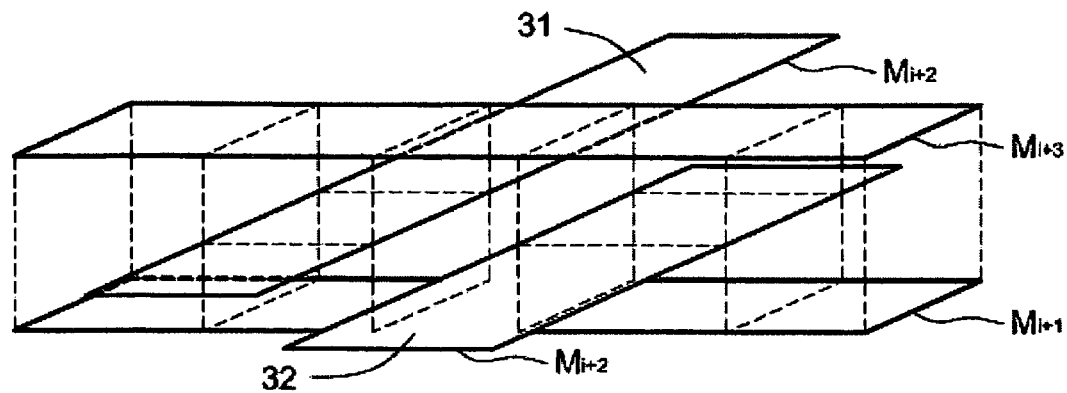
FIG. 3A shows a layout that is well designed and includes the power supply layers $M_{i+3}$ and $M_{i+1}$, and a signal layer $M_{i+2}$.

The method for checking the overlapped region of the power layers according to an embodiment of the invention will be described in FIG. 3. FIG. 3A shows a circuit layout that is well designed and includes the power supply layers of an upper metal layer $M_{i+3}$ and a lower metal layer $M_{i+1}$, and a wire regions 31 and 32 of a middle layer $M_{i+2}$. Of course, an insulation layer is interposed between two adjacent layers. As shown in FIG. 3A, the signal layer $M_{i+2}$ has two wire regions 31 and 32. The method of the invention for checking the overlapped region of the power layers is to search the overlapped region of the upper and lower layers $M_{i+3}$ and $M_{i+1}$ without the wire regions 31 and 32 disposed between the upper and lower layers $M_{i+3}$ and $M_{i+1}$. That is, $$(M_{i+1} \cap M_{i+3}!(31 \text{ and } 32 \text{ of } M_{i+2}) \quad (3).$$

Figure 3B:
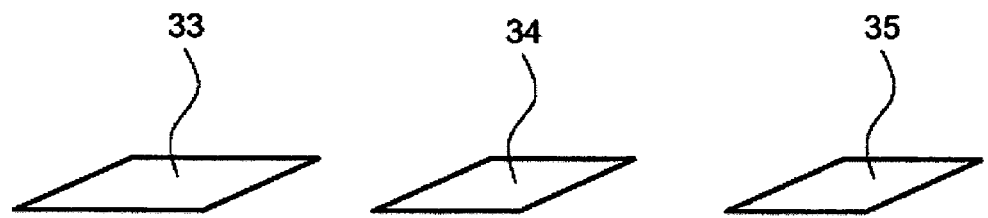
FIG. 3B shows the output region after the process of checking the overlapped region of the power layers in the layout of FIG. 3A.

It is possible to search the total overlapped region of the upper metal layer $M_{i+3}$ and the lower metal layer $M_{i+1}$, and then filter out the wire regions 31 or 32 of the middle layer $M_{i+2}$. FIG. 3B shows the regions 33, 34 and 35, which are outputted after checking the layout shown in FIG. 3A. Of course, the wires to be checked in the upper metal layer $M_{i+3}$ and the lower metal layer $M_{i+1}$ are power lines. Since it's not necessary to output the overlapped region with small area, the CAD software may set an adjustable threshold area and output the region having an area larger than the threshold area after comparing the area of each overlapped region to the threshold area. The layout engineer may refer to the region marked by the CAD software to modify the original circuit layout, such as adding a conductive metal layer in the region marked by the CAD software in the middle layer $M_{i+2}$, and providing vias between the metal layer and the upper metal layer $M_{i+3}$ and between the metal layer and the lower metal layer $M_{i+1}$. Thus, the wire's equivalent resistance causing the power source's voltage drop can be reduced.

Figures 4A, 4B:
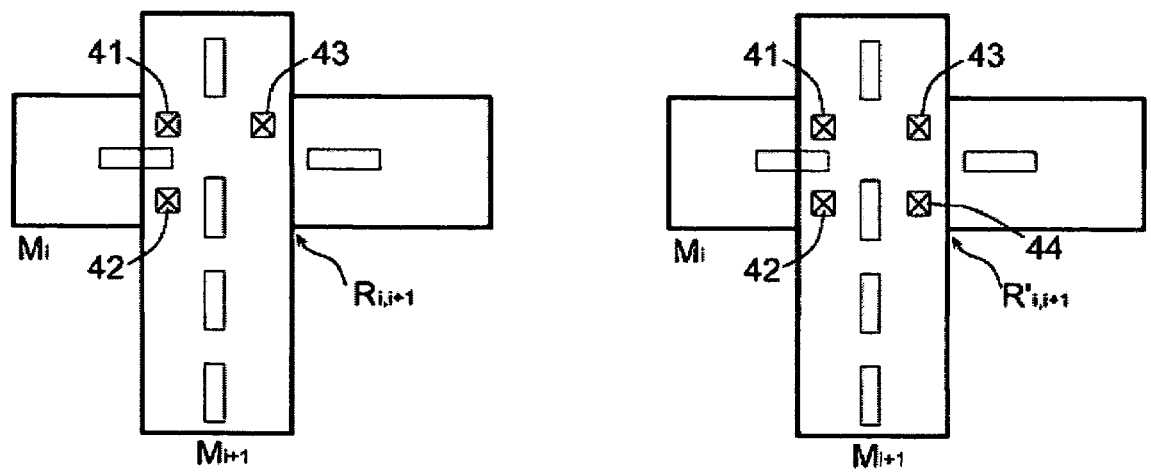
FIG. 4A shows the layout, wherein the upper and lower metal layers $M_i$ and $M_{i+1}$ are overlapped and conducted by vias.
FIG. 4B shows the layout with one more via compared to that of FIG. 4A.

FIG. 4A shows the layout, wherein the upper and lower metal layers $M_i$ and $M_{i+1}$ are overlapped and conducted by vias. As shown in this drawing, the metal layer $M_i$ is conducted to the metal layer $M_{i+1}$ by the vias 41, 42 and 43, and the equivalent wire resistance between the metal layers $M_i$ and $M_{i+1}$ is defined as $R_{i,i+1}$. FIG. 4B shows the layout similar to FIG. 4A, wherein the upper and lower metal layers $M_i$ and $M_{i+1}$ are overlapped and conducted using vias. As shown in this drawing, the metal layer $M_i$ is conducted to the metal layer $M_{i+1}$ by the vias 41, 42, 43 and 44, and the equivalent wire resistance between the metal layers $M_i$ and $M_{i+1}$ are defined as $R'_{i,i+1}$. Because the circuit layout in FIG. 4B has one more via compared to the layout shown in FIG. 4A, the equivalent resistance $R'_{i,i+1}$ is smaller than the equivalent resistance $R_{i,i+1}$ according to the above-mentioned description. So, the method for checking the area ratio of via area in the invention is used for checking a region with a smaller area ratio of via area, so as to reduce the equivalent resistance by adding vias in this region and thus to reduce the voltage drop.

The method for checking the ratio of the via area according to an embodiment of the invention will be described with reference to FIG. 5. FIG. 5A shows the layout, wherein the upper and lower metal layers $M_i$ and $M_{i+1}$ are overlapped and conducted by vias 51, 52, 53 and 54. The method for checking the ratio of via area is to search the overlapped region of the metal layers $M_i$ and $M_{i+1}$ such as the overlapped region 57 shown in FIG. 5C, wherein the overlapped region 57 excludes the region overlapping the metal slots 55 and 56 and the area of the overlapped region 57 is calculated as $A_{over}$. Next, the vias in the overlapped region 57 are found as shown in FIG. 5B, and the area of the vias 51, 52, 53 and 54 are calculated as $A_{via}$. Then, the area ratio $R_A$ is calculated by:

$$R_A = A_{via}/A_{over} \quad (4).$$

Since the region having large area ratio $R_A$ is not necessary to be output, a threshold value is set in advance and the CAD software can mark and output the overlapped region having an area ratio $R_A$ smaller than the threshold value. So, the layout engineer may increase the number of the vias in the output region, so as to reduce the equivalent wire resistance and thus reduce the voltage drop induced by the equivalent wire resistance.

FIG. 6A shows the layout of one metal layer. As shown in this drawing, the metal layer $M_i$ includes a contact pad 61 and wires 62, 63 and 64. FIG. 6B shows another layout of one metal layer. Referring to FIG. 6B, the metal layer $M_i$ includes a contact pad 61 and wires 62, 63' and 64. The layout of FIG. 6A is almost the same as that of FIG. 6B except for the difference that the wire 63' of FIG. 6B is wider than the wire 63 of FIG. 6A. According to the resistor's law, the smaller the cross-sectional area, the larger the resistance. So, the equivalent resistance of the wire 63 in FIG. 6A is larger than that of the wire 63' in FIG. 6B. If the contact pad 61 is a power connection pad, the electric current flowing through the wire 63 will be relatively large because the wire 63 is quite close to the power connection pad 61. Consequently, the voltage drop of the overall circuit is greatly influenced (increased) by the equivalent resistance of the wire 63. Thus, the wire line width can be checked according to the present invention, so as to find out the wire with narrow line width. The layout engineer may correct the designed circuit layout diagram according to the checked result.

Figure 7A:
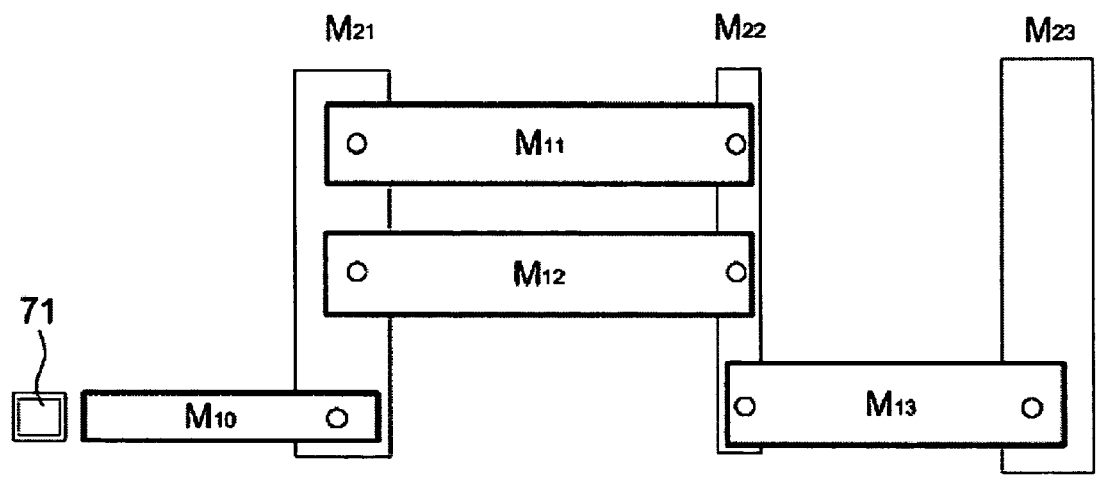
FIG. 7A shows the layout to be checked.
Figure 7B:
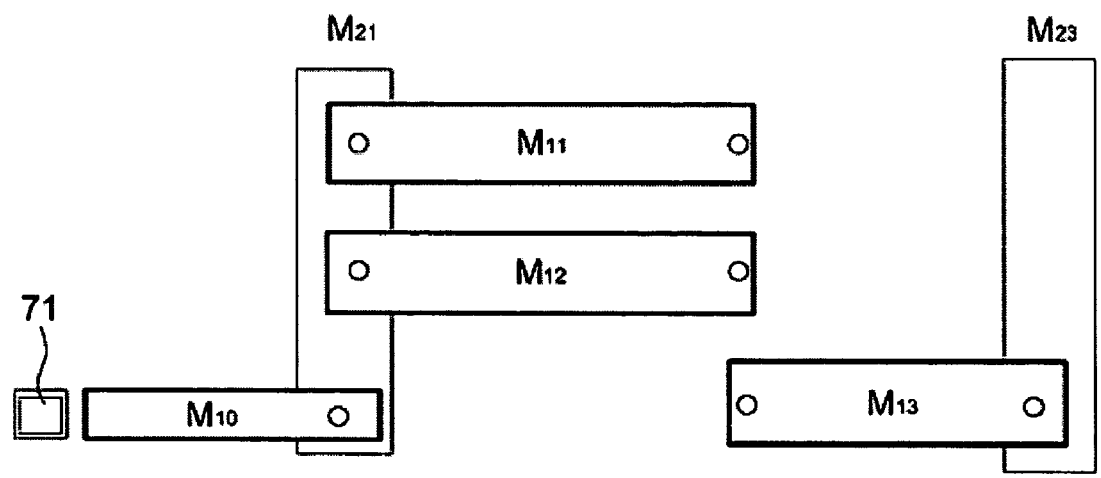
FIG. 7B shows the layout after checking the wire line width.

FIG. 7A shows the layout to be checked and FIG. 7B shows the layout after checking the wire line width. Referring to FIG. 7A, the layout includes a first layer of wires $M_{10}$, $M_{11}$, $M_{12}$ and $M_{13}$, and a second layer of wires $M_{21}$, $M_{22}$ and $M_{23}$, wherein the wire $M_{10}$ has a voltage source connection pad 71 coupled to the voltage source, and the wire $M_{22}$ is narrow. Referring to FIG. 7B, the layout includes a first layer of wires $M_{10}$, $M_{11}$, $M_{12}$ and $M_{13}$, and a second layer of wires $M_{21}$ and $M_{23}$. Obviously, the FIG. 7B lacks the wire $M_{22}$ compared to FIG. 7A.

The method for checking the wire line width in the embodiment of the invention includes: reading the circuit layout diagram of the power metal layer as shown in FIG. 7A, narrowing the wire line widths of all wires shown in the FIG. 7A according to a line width threshold value determined by the user, and regaining the original wire line width of the wire whose line width isn't narrowed to zero previously. Consequently, the wire (e.g., $M_{21}$) having a line width larger than the line width threshold value recovers to have its original line width, and the wire (e.g., $M_{22}$) having a line width smaller than the line width threshold value is eliminated as shown in FIG. 7B.

Finally, a corresponding metal wire network diagram is created according to the checked circuit layout diagram as shown in FIG. 7B, and each independent network in the drawing is further checked. If there is an independent network that does not contain the voltage source, the independent network is outputted as a problem network.

Figure 8A:
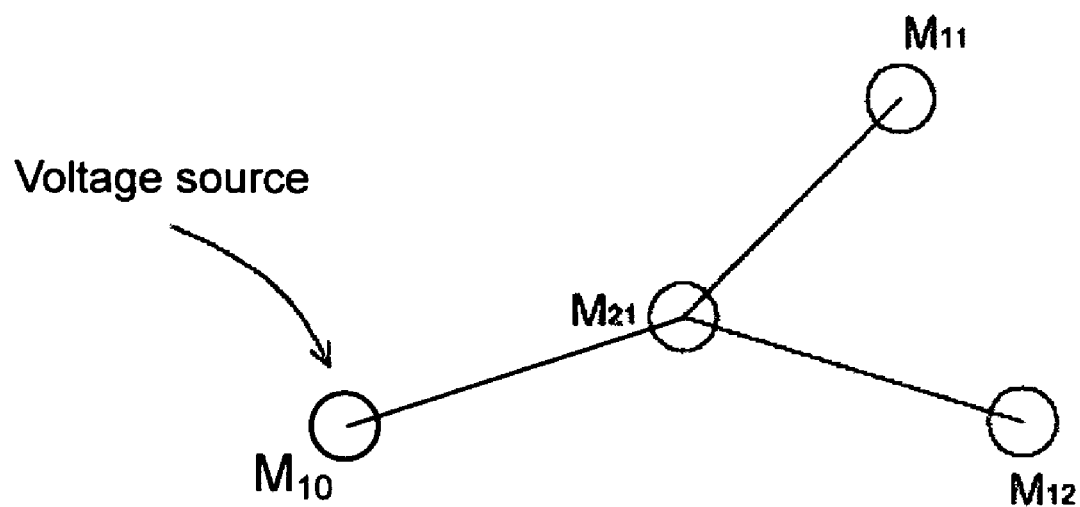
FIGS. 8A and 8B are network diagrams of the metal wires illustrated according to FIG. 7B.
Figure 8B:
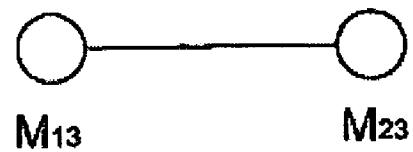

FIGS. 8A and 8B are network diagrams of the metal wires in accordance with FIG. 7B. In FIGS. 8A and 8B, each node corresponds to one metal wire of FIG. 7B, and two nodes are connected by a line segment if the nodes are coupled through a via. Hence, the circuit layout diagram of FIG. 7B may be illustrated as two independent networks of FIGS. 8A and 8B. The independent network of FIG. 8A includes the wire $M_{10}$ having the voltage source connection pad. Therefore, it means that the line width of the metal wire is all right in this independent network. In the independent network of FIG. 8B, however, no wire has a voltage source connection pad coupled to the voltage source. Thus, it means that the line width of the metal wire coupled to the metal wire having the voltage source connection pad is too narrow. So, the corresponding metal wires in FIG. 8B is marked and outputted, and the layout engineer may correct the layout according to the output information.

Figure 9:
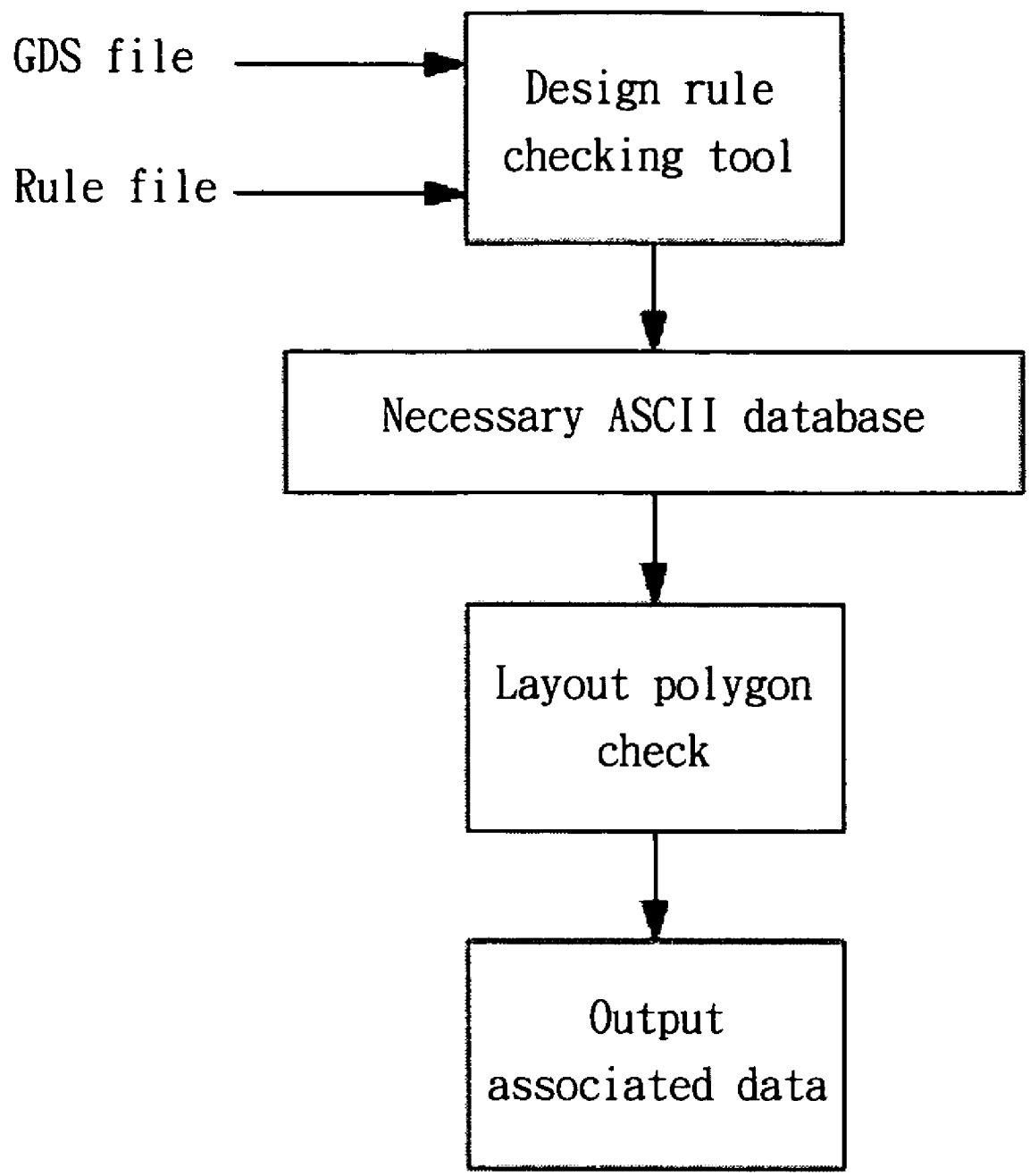
FIG. 9 shows the steps of the method according to an embodiment of the invention.

FIG. 9 shows the steps of the method for checking the circuit layout in the invention. First, a DRC (Design Rule Check) tool is used to dump the GDS file and the rule file. The DRC tool generates the necessary ASCII database. In the layout polygon check, the desired items, such as the power layers overlapped region checking, the via area ratio checking and the wire line width checking, may be checked according to the necessary ASCII database and the threshold value inputted by the user. Consequently, the associated data are then output.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for checking an IC layout, the IC layout comprising a first and a third power supply layers for transmitting power and a second metal layer disposed between the first and the third power supply layers, the first and the third power supply layers respectively comprising at least a power wire, the second metal layer comprising a wire region having at least a wire, the method comprising:
   selecting a region in the second metal layer exclusive of the wire region, wherein projections of the power wires of the first and the third power supply layers onto the second metal layer in a vertical direction are within the selected region; and
   disposing a metal plate within the selected region, wherein disposing the metal plate comprising:
   calculating an area of the selected region;
   determining whether the area of the selected region is larger than a threshold area; and
   disposing the metal plate if the area of the selected region is larger than the threshold area;
   providing vias for coupling the power wires of the first and third power supply layers through the metal plate, so as to reduce an equivalent resistance from a point of the power wire of the first or the third power supply layer to a terminal of a power source, wherein a voltage drop from the point to the terminal after disposing the metal plate is smaller than a voltage drop from the point to the terminal before disposing the metal plate.

2. The method according to claim 1, wherein the value of the threshold area is adjustable.

3. The method according to claim 1, wherein the wire of the wire region is used for transmitting a signal.

4. The method according to claim 1 being accomplished by a software.

5. The method according to claim 4, further comprising the step of reading a wire layout of a plurality of metal layers in the IC.

6. The method according to claim 1, wherein both of the first and third power supply layers are coupled to the power source.

* * * * *